(12) United States Patent
Nakazawa et al.

(10) Patent No.: US 6,379,484 B2
(45) Date of Patent: Apr. 30, 2002

(54) METHOD FOR MANUFACTURING A SEMICONDUCTOR PACKAGE

(75) Inventors: Takahito Nakazawa, Yokohama; Hiroshi Nomura, Yokosuka; Yumiko Ohshima, Yokohama, all of (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/730,193

(22) Filed: Dec. 5, 2000

Related U.S. Application Data

(62) Division of application No. 09/294,955, filed on Apr. 20, 1999, now Pat. No. 6,191,024, which is a division of application No. 08/902,349, filed on Jul. 29, 1997, now Pat. No. 5,935,375.

(30) Foreign Application Priority Data

Jul. 30, 1996 (JP) .............................................. 8-200293

(51) Int. Cl.$^7$ ............................................... H01L 21/28
(52) U.S. Cl. .......................... 156/87; 156/305; 156/356; 156/578; 427/96; 29/832; 29/739
(58) Field of Search ................................ 156/291, 292, 156/305, 87, 356, 578; 29/830, 832, 739, 740, 741; 257/778; 438/108, 118; 427/207.1, 96

(56) References Cited

U.S. PATENT DOCUMENTS

| | | | | |
|---|---|---|---|---|
| 5,362,354 A | | 11/1994 | Okura et al. ................. | 156/356 |
| 5,710,071 A | * | 1/1998 | Beddingfield et al. ....... | 257/778 |
| 5,747,102 A | | 5/1998 | Smith et al. ................... | 427/96 |
| 5,872,051 A | | 2/1999 | Fallon et al. ................. | 438/616 |
| 5,889,332 A | * | 3/1999 | Lawson et al. .............. | 257/778 |
| 5,935,375 A | | 8/1999 | Nakazawa et al. ........... | 156/356 |
| 5,939,206 A | | 8/1999 | Kneezel et al. .............. | 428/480 |
| 5,939,326 A | | 8/1999 | Chupp et al. ................. | 436/43 |
| 6,124,643 A | * | 9/2000 | Brand ......................... | 257/787 |

* cited by examiner

Primary Examiner—Jeff H. Aftergut
Assistant Examiner—John T. Haran
(74) Attorney, Agent, or Firm—Hogan & Hartson, L.L.P.

(57) ABSTRACT

An apparatus is provided for manufacturing a semiconductor package of the type in which a gap between a semiconductor chip and a mount board is filled with a resin. The apparatus includes resin supply means for supplying the resin along one side of the semiconductor chip, and resin supply control means for controlling the amount of resin supplied by the resin supply means such that more resin is supplied near the central portion of the semiconductor chip than near the end portions of the semiconductor chip. Also provided is a method that includes the steps of connecting the semiconductor chip and the mount board, and supplying the resin along one side of the semiconductor chip in such a manner that more resin is supplied near a central portion of the semiconductor chip than near the end portions of the semiconductor chip. According to the present invention, the resin is supplied such that it is relatively less concentrated near the peripheral portions of the chip so the resin spreads throughout the entire gap at substantially the same time as it flows along the peripheral portion of the chip. Thus, the formation of resin-less voids in the gap is deterred so that the grade and quality of the semiconductor device is improved.

5 Claims, 8 Drawing Sheets

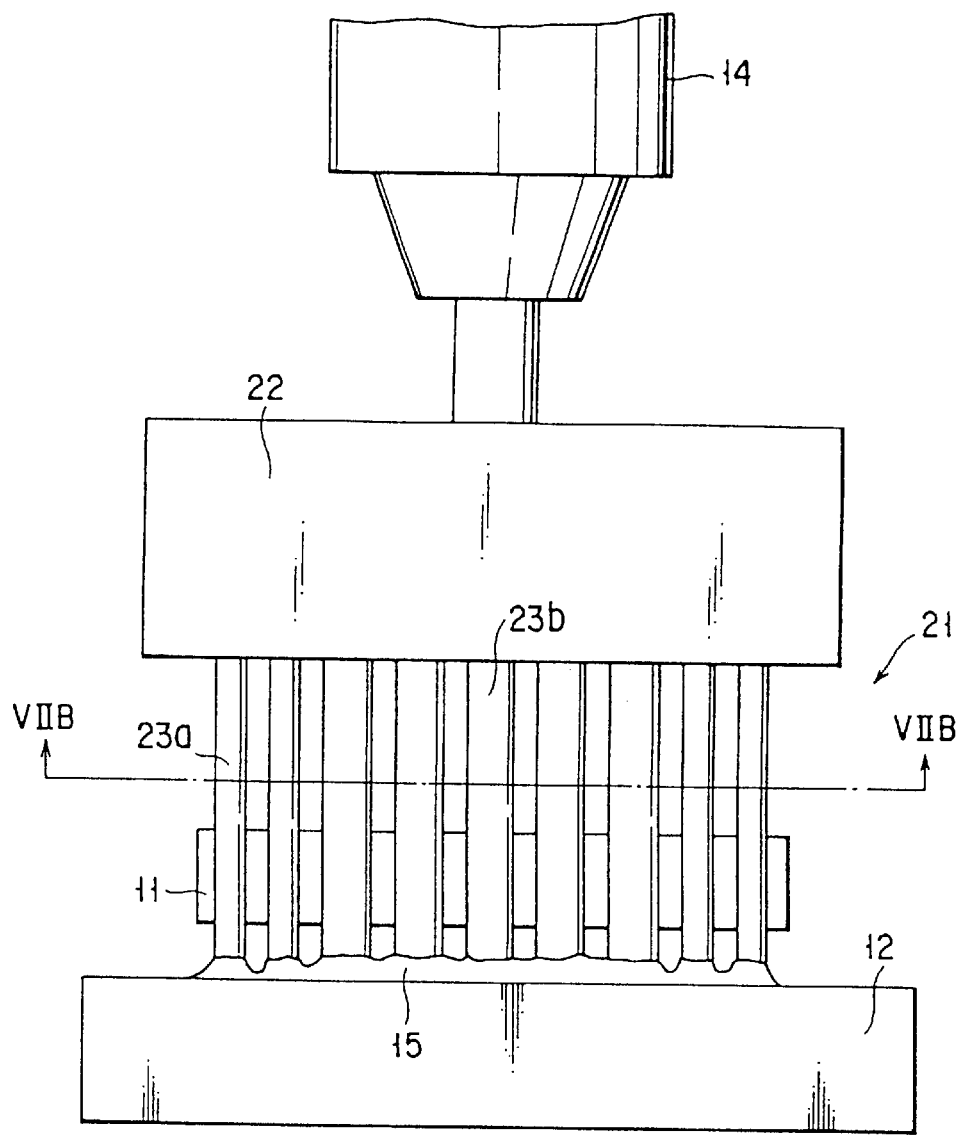
F I G. 7A
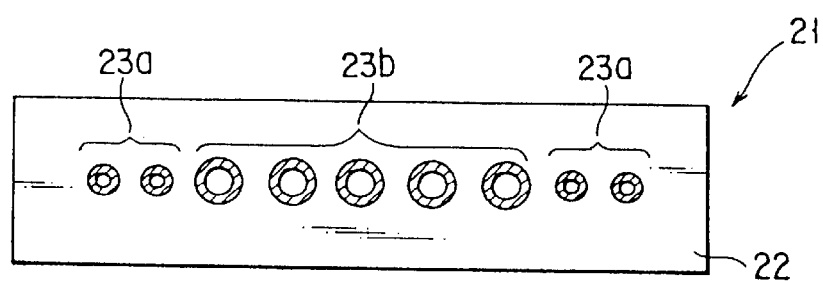
F I G. 7B

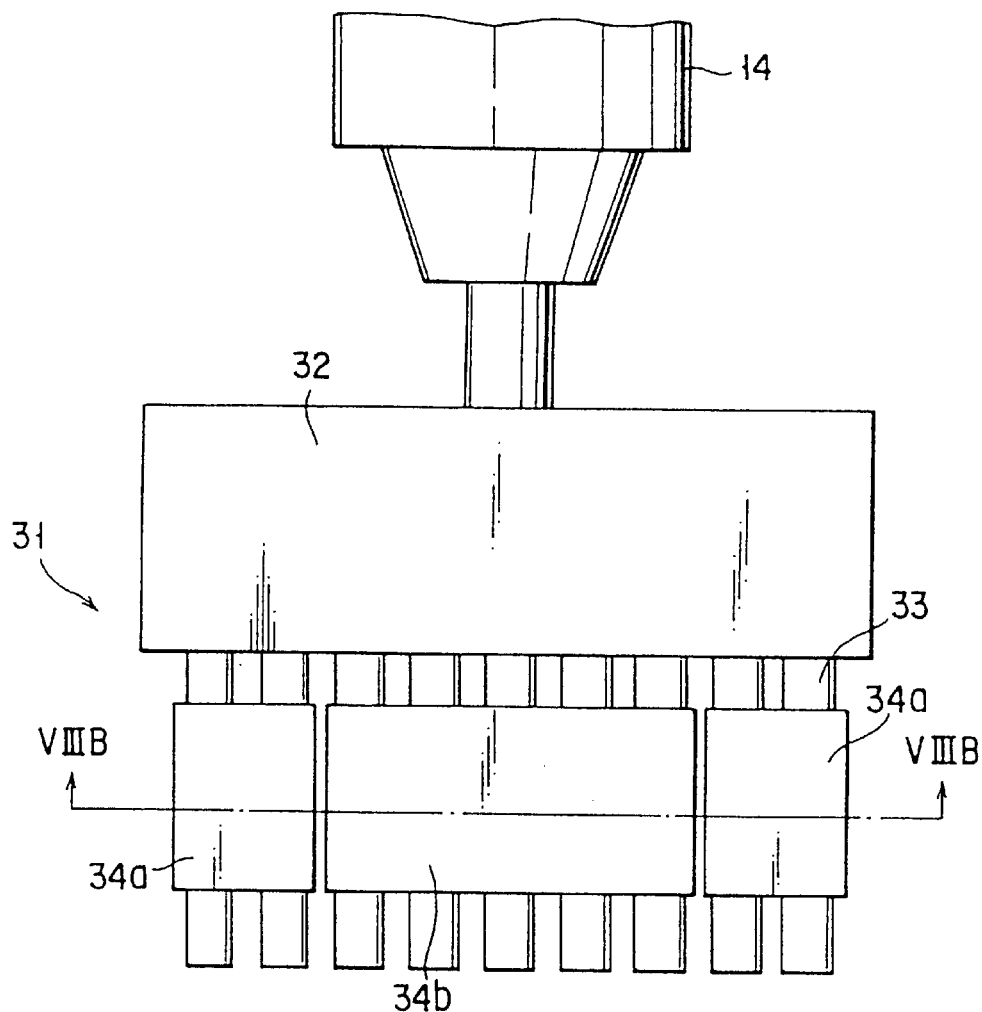
F I G. 8A
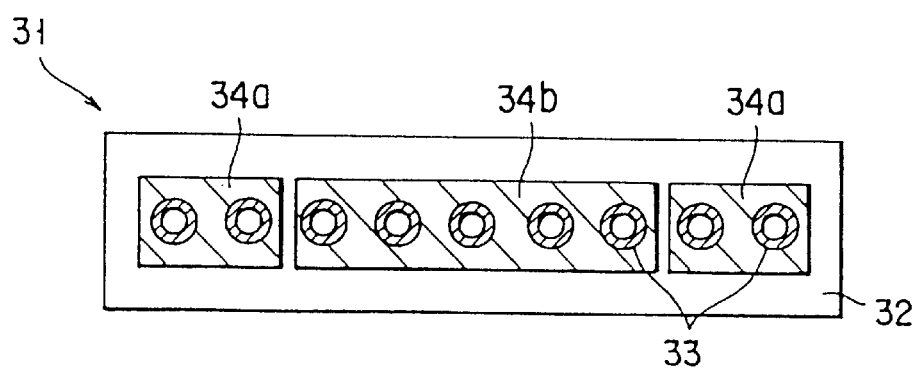
F I G. 8B

F I G. 12A
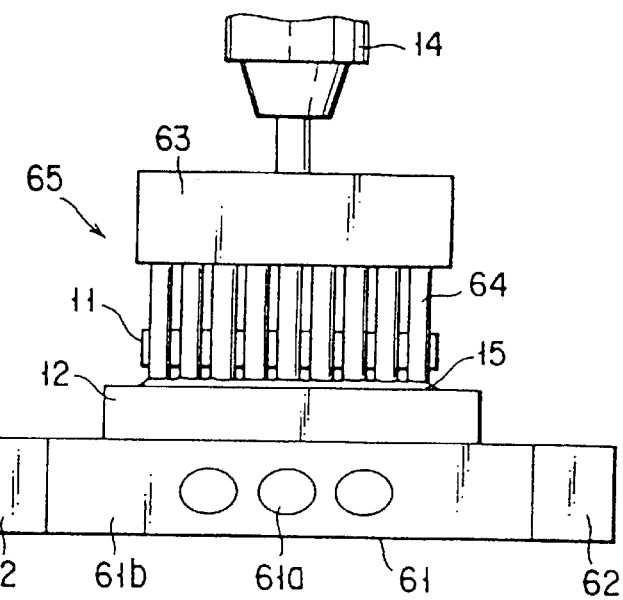
F I G. 12B
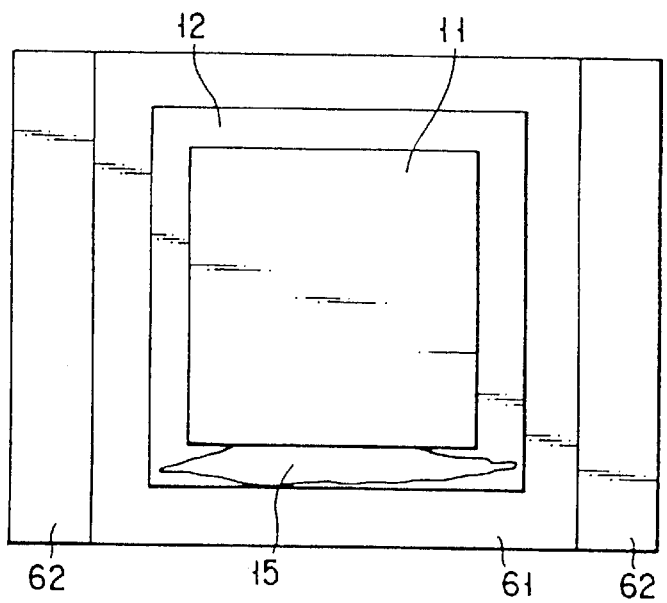
F I G. 12C
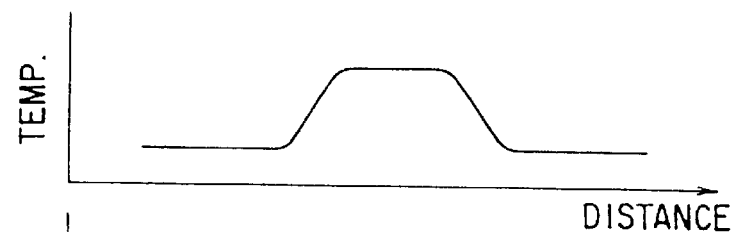
F I G. 12D
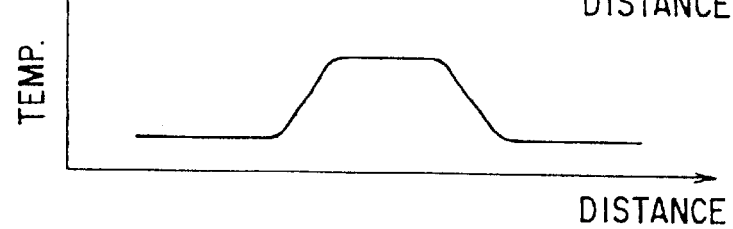

METHOD FOR MANUFACTURING A SEMICONDUCTOR PACKAGE

This is a division of application Ser. No. 09/294,955 now U.S. Pat. No. 6,191,024, filed Apr. 20, 1999, which is a divisional of application Ser. No. 08/902,349, filed Jul. 29, 1997 now U.S. Pat. No. 5,935,375, which applications are hereby incorporated by reference in their entirety.

BACKGROUND OF THE INVENTION

This invention relates to an apparatus and method for manufacturing a flip-chip-type semiconductor package, and more specifically to an apparatus and method for manufacturing a semiconductor package in which formation of a resin-less void in the gap between the semiconductor chip and a mount board is suppressed, so that the grade and quality of the semiconductor device is improved.

There has recently been developed a "flip-chip" method for packaging semiconductor chips. The flip-chip method produces a small semiconductor package in which a semiconductor chip is bonded to a mount board. Typically, solder bumps are formed on the electrode pads of the semiconductor chip, and the solder bumps are connected to the pads and wiring of the mount board. A resin is filled in a gap between the semiconductor chip and the mount board to secure the package. FIG. 1 shows a conventional method for fabricating a semiconductor package that has a semiconductor chip and a mount board connected in a flip-chip manner with a resin filled in the gap between the semiconductor chip and the mount board. As shown, a semiconductor chip 1 is flip-chip-connected to a mount board 2, and a syringe 4 is moved by means of a driving mechanism 3 along one side of the semiconductor chip 1 in the direction indicated by the arrow in the figure.

As the syringe is moved along the chip, a resin 5 contained in the syringe 4 is supplied (for bonding) from the tip of a nozzle 6. Ideally, the resin would gradually enter the gap and would flow from the left to the right by virtue of a capillary phenomenon until the entire gap between the semiconductor chip 1 and mount board 2 was filled with the resin, as shown in FIGS. 2A to 2C. However, the rate at which the resin enters the gap between the chip and mount board is typically lower than the rate at which the resin advances around the periphery of the semiconductor chip. Thus, using the conventional method in which the resin is uniformly supplied by a syringe driven at a constant speed, it is difficult to completely fill the gap between the semiconductor chip and the mount board.

FIGS. 3A to 3C show see-through views of the semiconductor chip to illustrate how the resin typically enters the gap between the semiconductor chip and mount board when the conventional method is used. Initially, as shown in FIG. 3A, a resin 5 is deposited along one side of the semiconductor chip 1. The mount board 2 has a substantially flat surface and a substantially uniform in-plane temperature distribution, so the resistance to the flow of the resin near the central portion of the semiconductor chip is higher than around the peripheral portion of the chip. Due to this difference, the rate at which the resin enters the gap is lower than the rate at which the resin advances around the periphery of the semiconductor chip, as shown in FIG. 3B. Consequently, the resin may fail to completely fill the gap, and instead enclose air (or peripheral atmosphere) so that a void 7 is formed, as shown in FIG. 3C. The void 7 lowers the grade and quality of the semiconductor device because it can lead to defects or cracks. More specifically, moisture entering the void can deteriorate the solder bridge, short-circuit the wiring elements on the mount board, or crack the semiconductor device.

As explained above, when the conventional method is used, resin-less voids tend to form in the gap between the semiconductor chip and the mount board, and thus the grade and quality of the resultant semiconductor device are lowered.

BRIEF SUMMARY OF THE INVENTION

In view of these problems, it is an object of the present invention to remove the above-mentioned drawbacks and to provide an apparatus and method for manufacturing a semiconductor package in which the formation of resin-less voids is deterred so that the grade and quality of the semiconductor device is improved.

To achieve this object, one preferred embodiment of the present invention provides an apparatus for manufacturing a semiconductor package of the type in which a gap between a semiconductor chip and a mount board is filled with a resin. The apparatus includes resin supply means for supplying the resin along one side of the semiconductor chip, and resin supply control means for controlling the amount of resin supplied by the resin supply means such that more resin is supplied near the central portion of the semiconductor chip than near the end portions of the semiconductor chip. The apparatus supplies the resin such that it is relatively less concentrated near the peripheral portions of the chip, and thus the rate at which the resin flows near the peripheral portions of the chip is reduced. As a result, the formation of resin-less voids is deterred.

In another preferred embodiment of the present invention, the object is achieved by providing a method for manufacturing a semiconductor package of the type in which a gap between a semiconductor chip and a mount board is filled with a resin. The method includes the steps of connecting the semiconductor chip and the mount board, and supplying the resin along one side of the semiconductor chip in such a manner that more resin is supplied near a central portion of the semiconductor chip than near the end portions of the semiconductor chip. Accordingly, the resin is supplied such that it is relatively less concentrated near the peripheral portions of the chip. As a result, the formation of resin-less voids is deterred.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the scope of the present invention.

BRIEF DESCRIPTION OF THE SEVERAL VIEWS OF THE DRAWING

FIGS. 7A and 7B are views showing a multi-nozzle for supplying the resin according to a second embodiment of the present invention;

FIGS. 8A and 8B are views showing another multi-nozzle for supplying the resin according to a third embodiment of the present invention;

FIGS. 12A to 12D are views showing a method for manufacturing a semiconductor package according to a sixth embodiment of the present invention.

DETAILED DESCRIPTION OF THE INVENTION

Preferred embodiments of the present invention will be described in detail hereinbelow with reference to the attached drawings.

Figure 1:
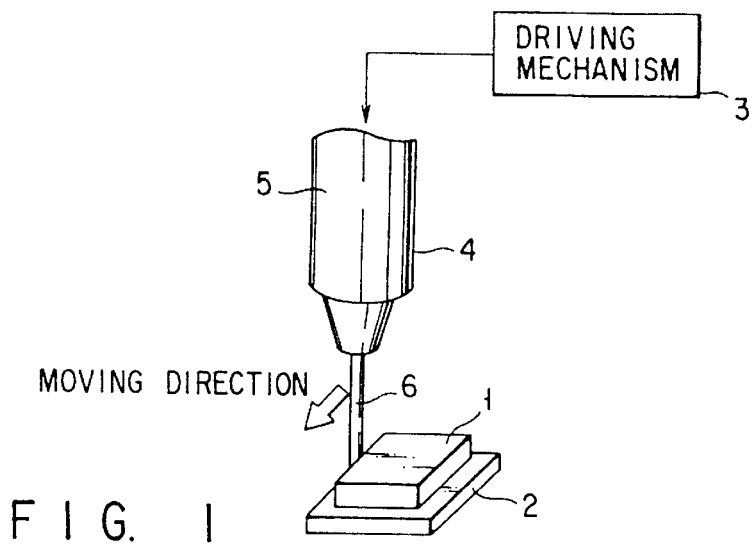
FIG. 1 is a view showing a conventional method for manufacturing a semiconductor package.
Figures 2A, 2B, 2C:
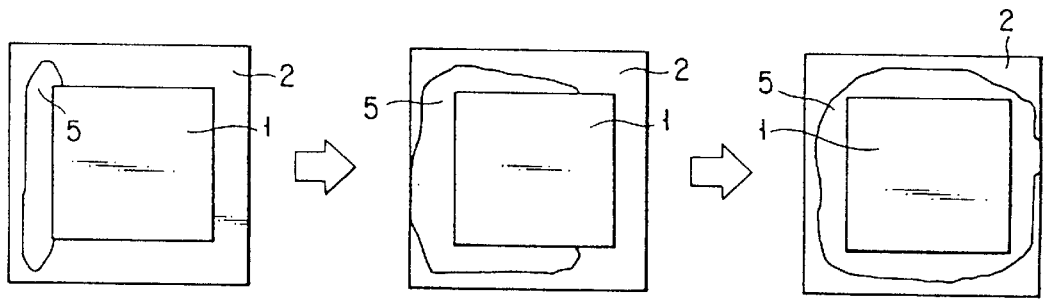
FIGS. 2A to 2C are views illustrating how the resin should fill the gap between the semiconductor chip and the mount board.
Figures 3A, 3B, 3C:
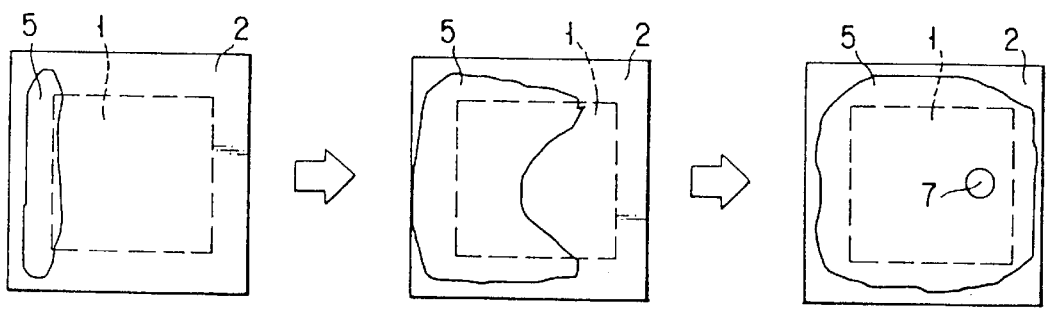
FIGS. 3A to 3C are see-through views of the semiconductor chip illustrating how the resin enters the gap in the conventional method.
Figure 4:
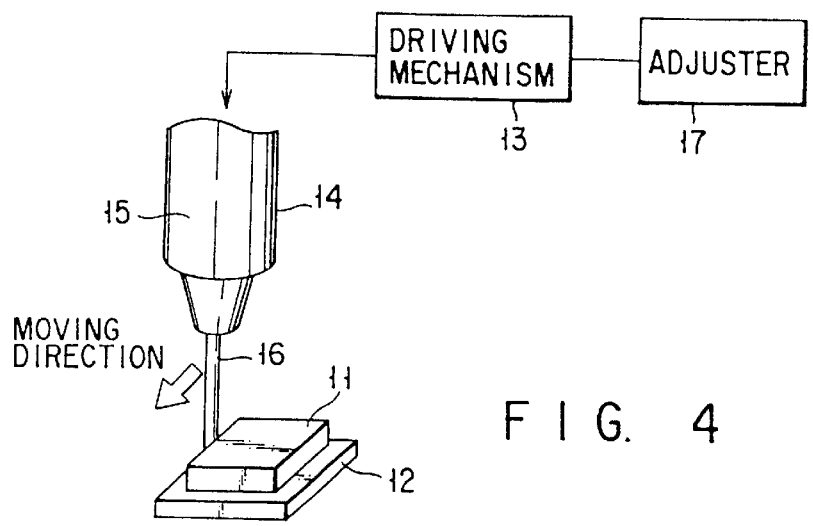
FIG. 4 is a view showing a method for manufacturing a semiconductor package according to a first embodiment of the present invention.

FIG. 4 shows a method for manufacturing a semiconductor package according to a first embodiment of the present invention. A semiconductor chip 11 is mounted on a mount board 12 by a flip-chip connection, and then a driving mechanism 13 moves a syringe 14 along one side of the semiconductor chip (in the direction indicated by the arrow in the figure). In more detail, the semiconductor chip 11 is provided with electrode pads that are arranged along the periphery of the chip. Wiring pads are arranged on the surface of the mount board 12 at positions corresponding to the electrode pads of the semiconductor chip 11, and are connected to the electrode pads via metal bumps (e.g., solder bumps). The wiring pads are led out of the bottom surface of the mount board 12 via through-holes and are connected to external pads that are arranged, for example, in a matrix on the reverse surface of the mount board. The mount board is typically formed with materials such as epoxy resin, alumina ($Al_2O_3$), aluminum nitride (AlN), and/or silicon carbide (SiC).

As the syringe 14 is moved along the chip, a resin 15 contained in the syringe is supplied through a nozzle 16 to one end portion of the mount board. In this embodiment, the amount of resin that is deposited at any point along the side of the semiconductor chip is controlled by adjusting the speed of movement of the nozzle 16 along the chip. In particular, the flow of resin from the syringe 14 is made constant, and an adjuster 17 controls the driving mechanism 13 to make the nozzle 16 move along the end portions of the chip more quickly than it moves along the central portion of the chip. Because the amount of resin supplied at any point is proportional to the movement speed of the nozzle 16, the amount of resin that is supplied to the mount board near the end portions of the semiconductor chip is less than is supplied to the mount board near the central portion of the chip. Thus, the resin 15 is relatively concentrated near the central portion of the semiconductor chip 11, so the rate at which the resin flows in the gap near the peripheral and side portions of the chip is lower than the rate at which the resin flows in the gap near the central portion of the chip. Because the resin flows more quickly near the central portion of the chip, the resin entering the gap gradually advances by virtue of the capillary phenomenon until the gap is completely filled with the resin.

Figures 5A, 5B, 5C:
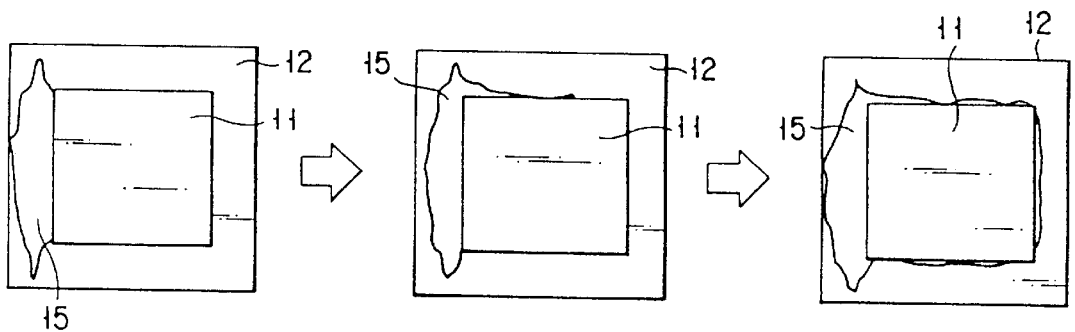
FIGS. 5A to 5C are views illustrating how the resin enters the gap between the semiconductor chip and the mount board in the method of FIG. 4.
Figures 6A, 6B, 6C:
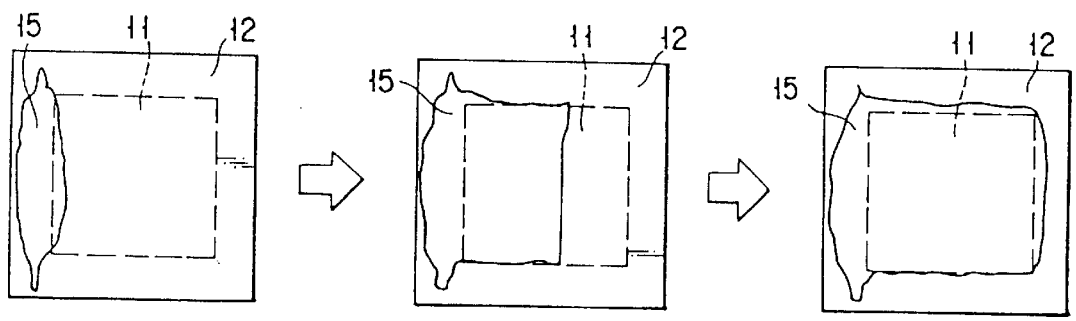
FIGS. 6A to 6C are see-through views of the semiconductor chip illustrating how the resin enters the gap in the method of FIG. 4.

FIGS. 5A to 5C illustrate how the resin completely fills the gap between the semiconductor chip and mount board, with FIGS. 6A to 6C showing see-through views of the semiconductor chip. As explained above, the movement speed of the syringe is controlled so that a smaller amount of resin is supplied near the ends of the chip 11. Because the resin is relatively less concentrated near the peripheral portions of the chip, the rate at which the resin flows near the peripheral portions of the chip is reduced. As a result, the resin 15 spreads throughout the entire gap at substantially the same time as it flows along the peripheral portion of the chip so air (or peripheral atmosphere) is not enclosed in the gap to form a resin-less void. Thus, a high-grade, high-quality semiconductor device is produced.

In the first embodiment of the present invention, the amount of a resin supplied near the end portions of the semiconductor chip is reduced by changing the movement speed of the nozzle. In further embodiments, similar advantages can be obtained by changing the configuration of the nozzle or by causing the mount board to have a non-uniform temperature distribution. FIGS. 7A and 7B show a multi-nozzle for supplying the resin according to a second embodiment of the present invention. FIG. 7A is a side view of the nozzle, and FIG. 7B is a sectional view taken along line VIIB—VIIB of FIG. 7A.

In the second embodiment, a multi-nozzle (i.e., resin supply control means) 21, which is used to supply the resin along one side of the semiconductor chip, is formed by a nozzle support body 22 and nozzles 23a that are arranged in a row. In more detail, the nozzles 23a arranged near the end portions of the semiconductor chip 11 have a relatively small inner diameter, and the nozzles 23b arranged near the central portion of the chip have a relatively large inner diameter. Because the amount of resin supplied over a period of time increases as the inner diameter of the nozzle is made larger, the larger-diameter nozzles 23b can supply more resin than the smaller-diameter nozzle 23a in the same time period. Thus, like the first embodiment, the resin is relatively more concentrated near the central portion of the chip, and the rate at which the resin flows near the peripheral portions of the chip is reduced. Accordingly, the different diameter nozzles minimize the difference between the rate at which the resin flows near the peripheral portions and the rate at which the resin flows near the central portion of the chip, so that the formation of resin-less voids is deterred.

FIGS. 8A and 8B show a multi-nozzle for supplying the resin according to a third embodiment of the present invention. FIG. 8A is a side view of the nozzle, and FIG. 8B is a sectional view taken along line VIIIB—VIIIB of FIG. 8A. In the third embodiment, a multi-nozzle 31, which is used to supply the resin along one side of the semiconductor chip, includes a nozzle support body 32, nozzles 33 with the same diameter arranged in a row, and heaters (resin supply control means) 34. The heaters 34a arranged near the end portions of the semiconductor chip maintain the corresponding nozzles 33 at a relatively low temperature, and the heater 34b arranged near the central portion of the chip maintains the corresponding nozzles 33 at a relatively high temperature.

Because the amount of resin supplied over a period of time is proportional to its viscosity, the higher temperature nozzles can supply more resin than the lower-temperature nozzles in the same time period. Thus, like the first and second embodiments, the resin is relatively more concentrated near the central portion of the chip, and the rate at which the resin flows near the peripheral portions of the chip is reduced. Accordingly, the non-uniform temperature distribution caused by the heaters minimizes the difference between the rate at which the resin flows near the peripheral portions and the rate at which the resin flows near the central portion of the chip, so that the formation of resin-less voids is deterred.

Figure 9A:
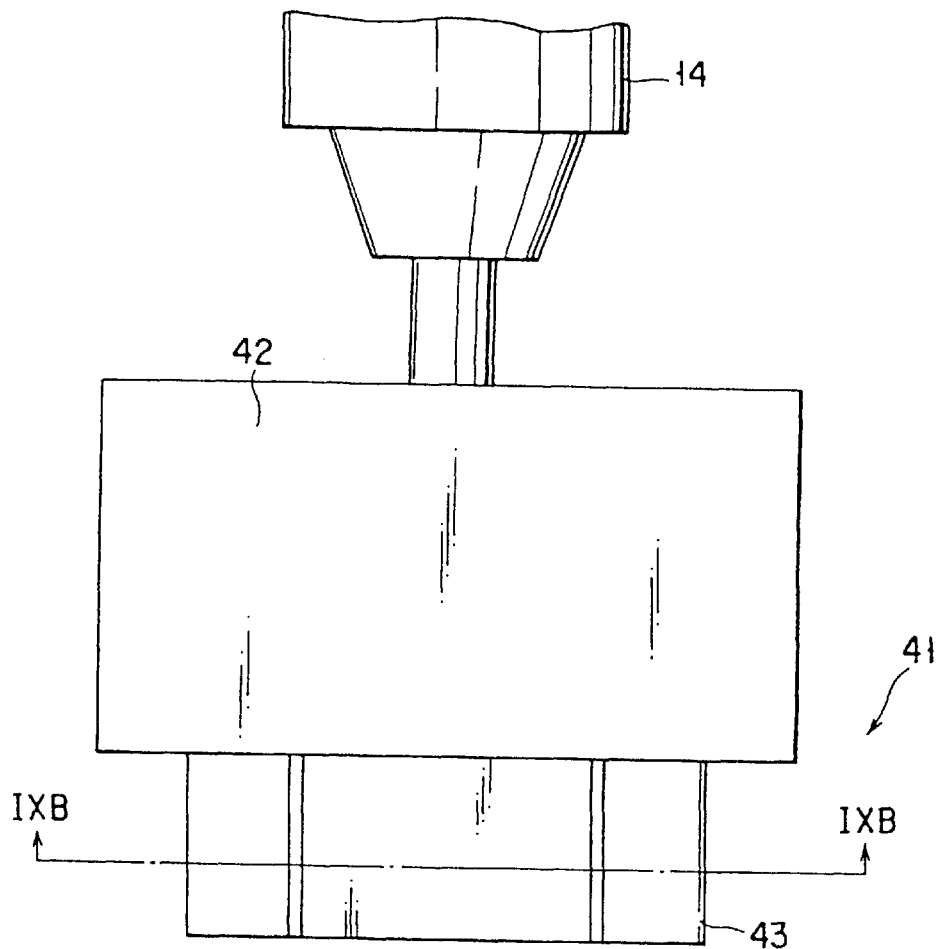
FIGS. 9A and 9B are views showing a nozzle with an elongated port for supplying the resin according to a fourth embodiment of the present invention.
Figure 9B:
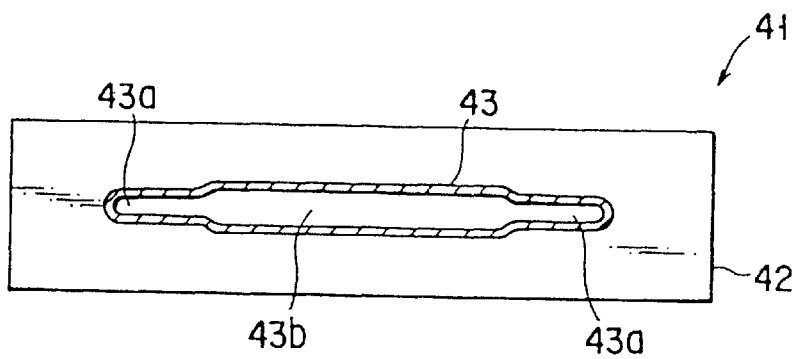

FIGS. 9A and 9B show a nozzle for supplying the resin according to a fourth embodiment of the present invention. FIG. 9A is a side view of the nozzle, and FIG. 9B is a sectional view taken along line IXB—IXB of FIG. 9A. In the fourth embodiment, an elongated nozzle 41, which is used to supply the resin along one side of the semiconductor chip, includes a nozzle support body 42, and a flat-port single nozzle (resin supply control means) 43. The portions 43a of the nozzle corresponding to the end portions of the semiconductor chip have a relatively narrow width, and the portion 43b of the nozzle corresponding to the central portion of the chip has a relatively wide width.

Because the amount of resin supplied over a period of time is proportional to the port width, the wider portion of the nozzle can supply more resin than the narrower portions 43a of the nozzle. Thus, like the first to third embodiments, the resin is relatively more concentrated near the central portion of the chip, and the rate at which the resin flows near the peripheral portions of the chip is reduced. Accordingly, the variable-width elongated nozzle minimizes the difference between the rate at which the resin flows near the peripheral portions and the rate at which the resin flows near the central portion of the chip, so that the formation of resin-less voids is deterred.

Figure 10A:
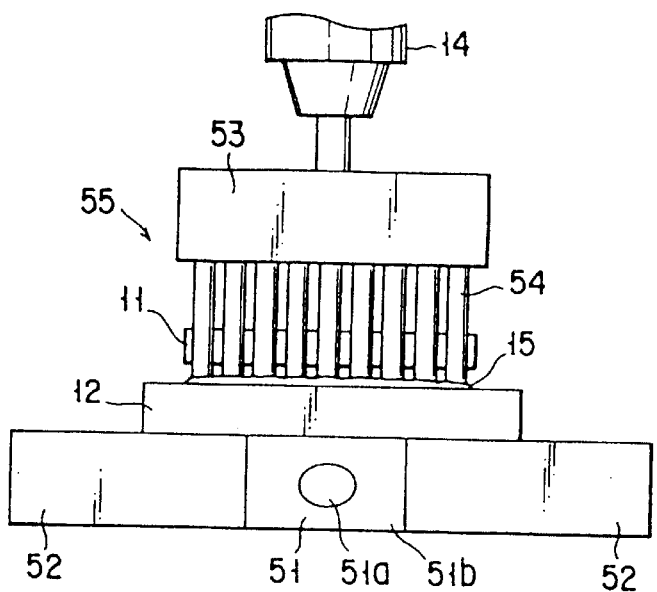
FIGS. 10A to 10D are views showing a method for manufacturing a semiconductor package according to a fifth embodiment of the present invention.
Figure 10B:
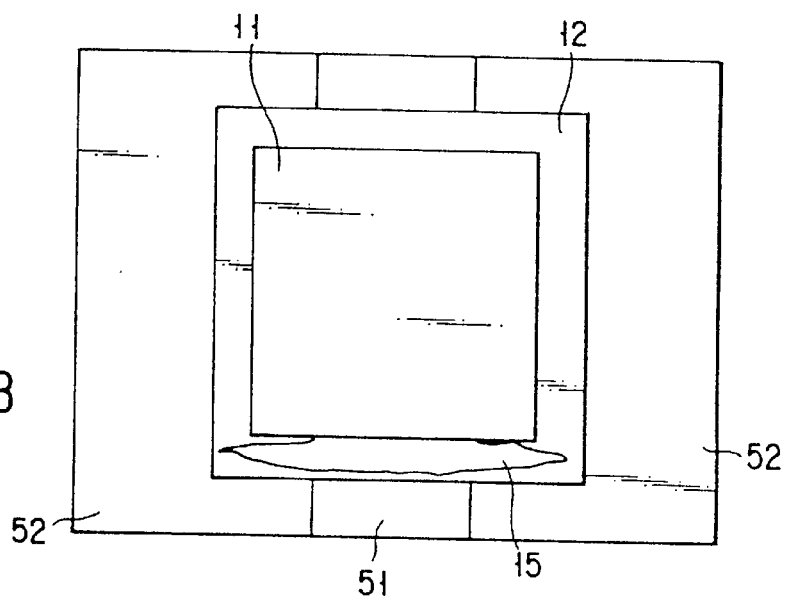
Figure 10C:
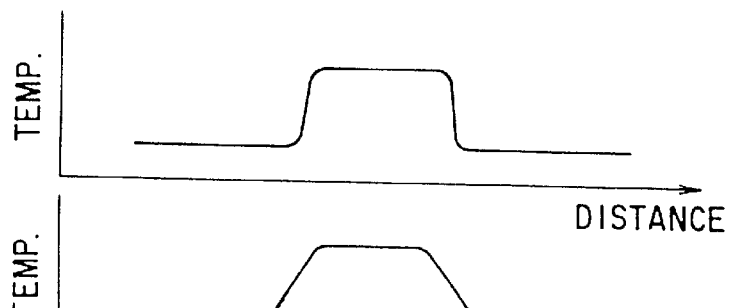
Figure 10D:
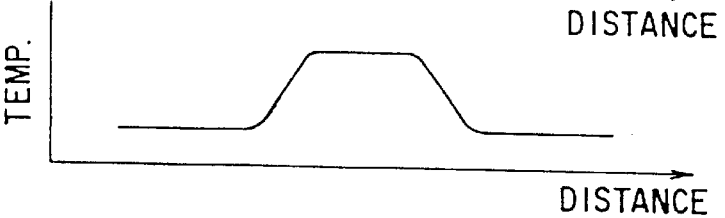

FIGS. 10 to 10D show a method for manufacturing a semiconductor package according to a fifth embodiment of the present invention. FIG. 10A shows a side view of an apparatus used in the fifth embodiment, FIG. 10B shows a top view of a portion of the apparatus of FIG. 10A, FIG. 10C shows the temperature distribution of the mount board, and FIG. 10D shows the temperature of the resin on the mount board. In the fifth embodiment, the mount board 12 is placed over a surface formed by a heater block 51 (resin supply control means) and radiator plates 52. In particular, the heater block is located beneath the portion of the mount board corresponding to the central portion of the semiconductor chip, and the radiator plates are located beneath the portions of the mount board corresponding to the end portions of the chip to impart a temperature difference between the different portions of the mount board. The heater block includes a heater rod 51a and a peripheral portion 51b that is illustratively formed of a ferrous metal. The radiator plates 52 are typically made from a material that radiates a greater amount of heat such as copper tungsten, alumina, aluminum nitride, or an aluminum/silicon/copper alloy.

Because the temperature of the mount board influences the viscosity of the resin, the viscosity of the resin flowing through the gap is partially varied by controlling the temperature distribution of the mount board so that the portions of the mount board corresponding to the end portions of the semiconductor chip are at a lower temperature than the portion of the mount board corresponding to a central portion of the chip. In other words, the heat radiation rate of the radiator plates 52 is higher than the heat radiation rate of the ferrous metal 51 so there exists a temperature difference across the mount board (FIG. 10C)). Thus, as the resin is supplied to the mount board (e.g., by a multi-nozzle 55 having a nozzle support body 53 and nozzles 54 with the same diameter), the viscosity of the resin near the central portion of the chip is reduced so that the rate at which the resin flows through the gap near the central portion of the chip is higher than the rate at which the resin flows near the peripheral portions of the chip (see FIG. 10D)). This behavior of the resin can be explained by capillary pressure and pressure loss, which are respectively given by the following formulas.

$$P = -\frac{2T\cos\theta}{H} \quad (1)$$

$$\frac{dP}{dX} = -\mu F \eta \quad (2)$$

Figure 11:
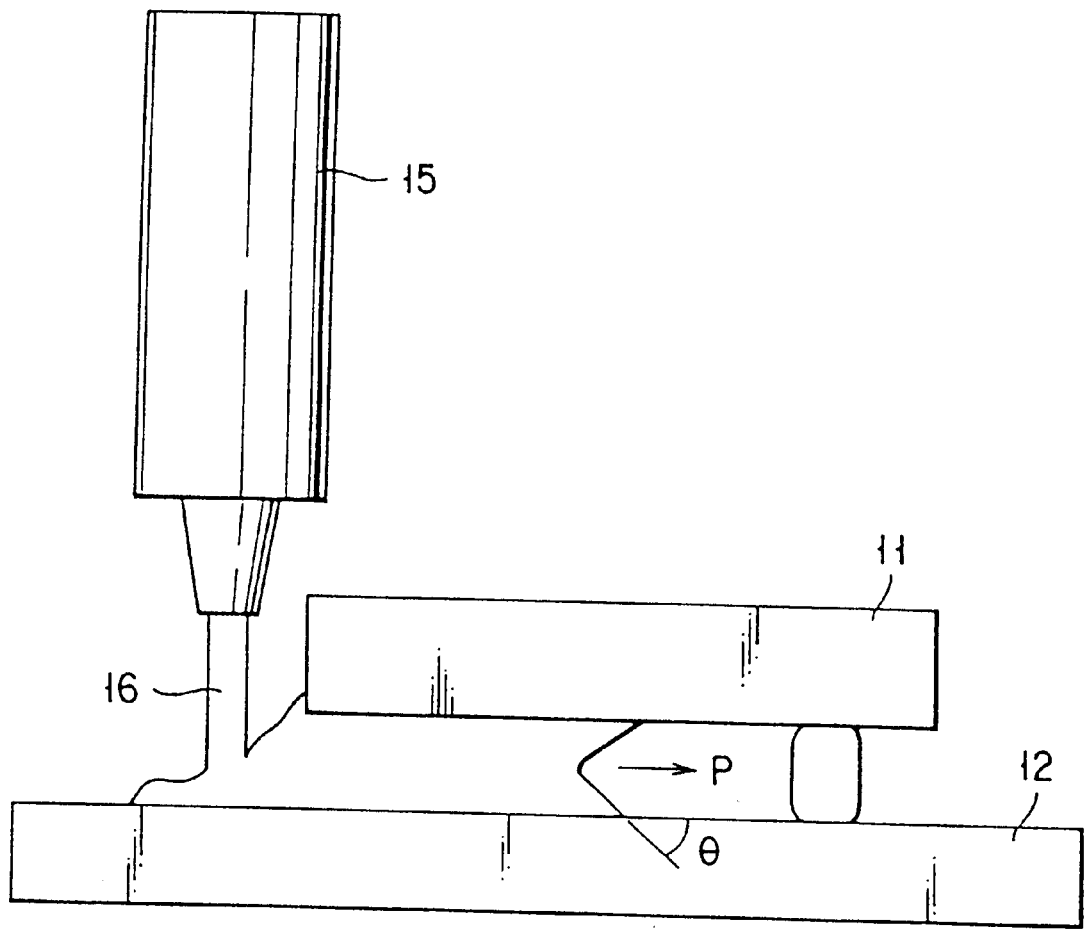
FIG. 11 is a view for explaining capillary pressure in the gap between the semiconductor chip and the mount board.

In these two equations, P is the capillary pressure, T is the surface tension, θ is the contact angle, H is the stand-off height, η is the viscosity of the resin, μ is the flow velocity, and F is the flow resistance (see FIG. 11). Accordingly, the combination of the heater block and radiator plates allows the resin to completely fill the gap so that a high-grade, high-quality semiconductor device is produced.

FIGS. 12A to 12D show a method for manufacturing a semiconductor package according to a sixth embodiment of the present invention. FIG. 12A shows a side view of an apparatus used in the sixth embodiment, FIG. 12B shows a top view of a portion of the apparatus of FIG. 12A, FIG. 12C shows the temperature distribution of the mount board, and FIG. 12D shows the temperature of the resin on the mount board. In the sixth embodiment, the mount board 12 is placed over the heater block 61 (resin supply control means), and the radiator plates 62 are positioned near the portions of the mount board 12 corresponding to the end portions of the semiconductor chip. In this embodiment, the radiator plates 62 dissipate heat from nearby portions of the surface of the heater block so that there is a gradually changing temperature difference between the portion of the mount board corresponding to the central portion of the semiconductor chip and the portions of the mount board corresponding to the end portions of the chip.

Similar to the fifth embodiment, the viscosity of the resin flowing through the gap is partially varied by controlling the temperature distribution of the mount board so that the portions of the mount board corresponding to the end portions of the semiconductor chip are at a lower temperature than the portion of the mount board corresponding to a central portion of the chip. Thus, as the resin is supplied to the mount board (e.g., by a multi-nozzle 65 having a nozzle support body 63 and nozzles 64 with the same diameter), the viscosity of the resin near the central portion of the chip is reduced so that the rate at which the resin flows through the gap near the central portion of the chip is higher than the rate at which the resin flows near the peripheral portions of the chip (see equations 1 and 2). Accordingly, the heater block and adjacent radiator plates allow the resin to completely fill the gap so that a high-grade, high-quality semiconductor device is produced.

In the fifth and sixth embodiments described above, a non-uniform temperature distribution is imparted to the mount board to control the flow of the resin in the gap between the semiconductor chip and the mount board. However, in further embodiments of the present invention, similar advantages can be obtained by heating the semiconductor chip so that is has a temperature higher than the temperature of the mount board. In one such embodiment, a radiator plate is placed under the mount board. Because of the heat radiation effect of the radiator plate and mount board, a temperature difference is imparted between the portion of the mount board corresponding to the central portion of the semiconductor chip and the portions of the mount board corresponding to the end portions of the chip. Thus, a similar effect on the flow of the resin in the gap is obtained.

As described above, the present invention provides an apparatus and method for manufacturing a semiconductor package in which the formation of resin-less voids is deterred so that the grade and quality of the semiconductor device is improved.

While there has been illustrated and described what are presently considered to be the preferred embodiments of the present invention, it will be understood by those in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A method for manufacturing a semiconductor package of the type in which a gap between a semiconductor chip and a mount board is filled with a resin, said method comprising the steps of:

connecting the semiconductor chip and the mount board;

supplying the resin along one side of the semiconductor chip in such a manner that more resin is supplied near a central portion of the semiconductor chip than near the end portions of the semiconductor chip; and wherein the step of supplying the resin includes imparting a non-uniform temperature distribution to one of the semiconductor chip and the mount board, and wherein a portion of the mount board corresponding to the central portion of the semiconductor chip is maintained at a higher temperature than portions of the mount board corresponding to the end portions of the semiconductor chip.

2. The method as defined in claim 1, wherein the resin is controlled to a temperature at which the resin is hard to cure.

3. A method for manufacturing a semiconductor package of the type in which a gap between a semiconductor chip and a mount board is filled with a resin, said method comprising the steps of:

connecting the semiconductor chip and the mount board; and supplying the resin along one side of the semiconductor chip in such a manner that more resin is supplied near a central portion of the semiconductor chip than near the end portions of the semiconductor chip, wherein the step of supplying the resin includes imparting a non-uniform temperature distribution to one of the semiconductor chip and the mount board; and wherein the central portion of the semiconductor chip is maintained at a higher temperature than the end portions of the semiconductor chip.

4. The method as defined in claim 3, wherein the resin is controlled to a temperature at which the resin is hard to cure.

5. A method for manufacturing a semiconductor package of the type in which a gap between a semiconductor chip and a mount board is filled with a resin, the method comprising:

connecting the semiconductor chip and the mount board; and supplying the resin along one side of the semiconductor chip in such a manner that more resin is supplied near a central portion of the semiconductor chip than near the end portions of the semiconductor chip, wherein supplying the resin includes supplying the resin through a plurality of nozzles, the nozzles are arranged in a row along the one side of the semiconductor chip, and the nozzles located near the central portion of the semiconductor chip are maintained at a higher temperature than the nozzles located near the end portions of the semiconductor chip, and the resin is controlled to a temperature at which the resin is hard to cure.

* * * * *